United States Patent
Brouse et al.

(10) Patent No.: US 7,271,748 B2
(45) Date of Patent: Sep. 18, 2007

(54) SYSTEM AND METHOD FOR PROVIDING A THERMOMETER CODED OUTPUT FILTER

(75) Inventors: Keith Charles Brouse, Murphy, TX (US); Paul E. Landman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/939,678

(22) Filed: Sep. 13, 2004

(65) Prior Publication Data

US 2006/0071828 A1   Apr. 6, 2006

(51) Int. Cl.
*H03M 9/00* (2006.01)

(52) U.S. Cl. .................. 341/100; 341/106

(58) Field of Classification Search ........... 341/100, 341/101, 106, 126; 375/345; 708/277
See application file for complete search history.

(56) References Cited

U.S. PATENT DOCUMENTS

| 5,550,542 | A  | * | 8/1996  | Inoue .................. 341/67 |
| 6,163,283 | A  |   | 12/2000 | Schofield |
| 6,232,899 | B1 | * | 5/2001  | Craven .................. 341/126 |
| 6,496,129 | B2 |   | 12/2002 | Dedic et al. |
| 6,707,865 | B2 | * | 3/2004  | Challa .................. 375/345 |
| 6,720,757 | B2 |   | 4/2004  | Khorram et al. |
| 6,950,841 | B2 | * | 9/2005  | Challa et al. .............. 708/277 |

* cited by examiner

*Primary Examiner*—Rexford Barnie
*Assistant Examiner*—Joseph Lauture
(74) *Attorney, Agent, or Firm*—Wade J. Brady, III; Frederick J. Telecky, Jr.

(57) ABSTRACT

Systems and methods are provided for providing a filtered, thermometer coded output signal from an N bit digital input, where N is an integer greater than one. A truncated lookup table provides a corresponding truncated thermometer code in response an address related to the N bit digital input. A code recovery assembly transforms the truncated thermometer code into a thermometer coded output according to a recovery bit associated with the N bit digital input.

20 Claims, 5 Drawing Sheets

| Address | Thermometer Coded Output |
|---|---|
| 0000 | 1 1 1 1 1 1 1 1 1 1 1 1 1 1 1 |
| 0001 | 1 1 1 1 1 1 1 1 1 1 1 1 1 1 0 |
| 0010 | 1 1 1 1 1 1 1 1 1 1 1 1 1 0 0 |
| 0011 | 1 1 1 1 1 1 1 1 1 1 1 1 0 0 0 |
| 0100 | 1 1 1 1 1 1 1 1 1 1 1 0 0 0 0 |
| 0101 | 1 1 1 1 1 1 1 1 1 1 0 0 0 0 0 |
| 0110 | 1 1 1 1 1 1 1 1 1 0 0 0 0 0 0 |
| 0111 | 1 1 1 1 1 1 1 1 0 0 0 0 0 0 0 |
| 1000 | 1 1 1 1 1 1 1 0 0 0 0 0 0 0 0 |
| 1001 | 1 1 1 1 1 1 0 0 0 0 0 0 0 0 0 |
| 1010 | 1 1 1 1 1 0 0 0 0 0 0 0 0 0 0 |
| 1011 | 1 1 1 1 0 0 0 0 0 0 0 0 0 0 0 |
| 1100 | 1 1 1 0 0 0 0 0 0 0 0 0 0 0 0 |
| 1101 | 1 1 0 0 0 0 0 0 0 0 0 0 0 0 0 |
| 1110 | 1 0 0 0 0 0 0 0 0 0 0 0 0 0 0 |
| 1111 | 0 0 0 0 0 0 0 0 0 0 0 0 0 0 0 |

Fig. 4

| Address | Truncated Thermometer Code |
|---|---|
| 000 | 1 1 1 1 1 1 1 1 |
| 001 | 1 1 1 1 1 1 1 0 |
| 010 | 1 1 1 1 1 1 0 0 |
| 011 | 1 1 1 1 1 0 0 0 |
| 100 | 1 1 1 1 0 0 0 0 |
| 101 | 1 1 1 0 0 0 0 0 |
| 110 | 1 1 0 0 0 0 0 0 |
| 111 | 1 0 0 0 0 0 0 0 |

Fig. 5

SYSTEM AND METHOD FOR PROVIDING A THERMOMETER CODED OUTPUT FILTER

TECHNICAL FIELD

The present invention relates generally to electrical circuits, and more particularly to systems and methods for providing a thermometer coded output from a filter.

BACKGROUND OF THE INVENTION

A thermometer coded output filter receives a binary coded input and provides a filtered value as a thermometer coded output. In binary coding, each bit represents a given power of two, depending on its place in the digital word. Accordingly, the first, or most significant bit, is more heavily weighted than the last bit. In a thermometer coded output, each bit is weighted equally, such that the value of the thermometer coded output is a function of the respective numbers of ones and zeros, not their associated places within a digital word.

FIG. 1 illustrates an example of a four tap finite impulse response filter 10. The filter 10 includes a first delay element 12, a second delay element 14, and a third delay element 16 connected in series. A digital input stream is passed through the delay elements to produce a four bit word, comprising the input to the first delay element 12 ($X_3$) and the respective outputs ($X_2$–$X_0$) of the first, second, and third delay elements 12, 14, and 16. Each bit of the four bit word is provided as an input to an associated one of a plurality of multipliers 22, 24, 26, and 28. Each multiplier (e.g., 22) outputs an associated constant when its associated input bit is one, and the additive inverse of its associated constant when its associated input bit is zero. The output of the multipliers 22, 24, 26, and 28 are summed at a series of adders 32, 34, and 36. The output of the last adder 36 in the series provides the filter output.

FIG. 2 illustrates an example of a thermometer coded output finite impulse response filter 50. The filter 50 includes a series of delay elements 52 that allow an N bit word to be extracted from a digital input stream for processing, where N is an integer greater than one. For example, the delay elements 52 can comprise a series of flip-flops, each holding a digital value representing a bit in the input stream. The extracted N bit word is provided to a lookup table 54. The lookup table 54 contains a series of $2^N$ addresses, representing each possible value for the N bit word. Each address has a corresponding thermometer coded output comprising $2^N-1$ bits. The input word is matched to one of the series of addresses, and a corresponding thermometer coded output is provided as the filter output. It will be appreciated that for an N bit input, the lookup table 54 requires the storage of $2^N \times 2^N-1$ bits to represent the N thermometer coded outputs. Each bit of storage consumes circuit board space, making the implementation of large lookup tables inefficient.

SUMMARY OF THE INVENTION

In accordance with an aspect if the present invention, a system is provided for providing a filtered, thermometer coded output signal from an N bit digital input, where N is an integer greater than one. A truncated lookup table provides a corresponding truncated thermometer code in response to an address related to the N bit digital input. A code recovery assembly transforms the truncated thermometer code into a thermometer coded output according to a recovery bit associated with the N bit digital input.

In accordance with another aspect of the present invention, a method is provided for transmitting a digital signal across a transmission channel. The digital signal is divided into M digital streams, where M is an integer greater than one. Respective N bit input signals, where N is an integer greater than one, are provided to M filters, each filter being associated with one of the M digital streams. Respective advance recovery bits are provided to the M filters. A given advance recovery bit is associated with a subsequent N bit input to its associated filter. Each of the M digital streams are filtered to produce M associated thermometer coded outputs. Each of the M thermometer coded outputs is precorrected for a distortion associated with the transmission channel. The thermometer coded outputs are combined to produce a thermometer coded digital signal.

BRIEF DESCRIPTION OF THE DRAWINGS

The foregoing and other aspects of the present invention will become apparent to those skilled in the art to which the present invention relates upon reading the following description with reference to the accompanying drawings.

FIG. 4 illustrates an exemplary lookup table that could be utilized within a thermometer coded output finite impulse response filter.

FIG. 5 illustrates a truncated lookup table in accordance with an aspect of the present invention.

DETAILED DESCRIPTION

The present invention is directed to a thermometer coded output finite impulse response filter that is efficient in terms of critical time and chip space. A truncated lookup table, which omits certain redundant elements of a conventional lookup table, is utilized in the filter to provide a space efficient alternative to prior approaches. The truncated lookup table does not directly provide a thermometer coded output for the system, instead providing a truncated thermometer code that can be expanded to the appropriate thermometer coded output at a code recovery assembly. The code recovery assembly can utilize a recovery bit from the original output to guide the expansion of the truncated code. To avoid any decrease in the time efficiency of the system associated with the code recovery assembly, a code recovery bit can be provided to the filter one clock cycle ahead of the digital input associated with the code recovery bit, reducing the critical path of the filter.

Figure 1:
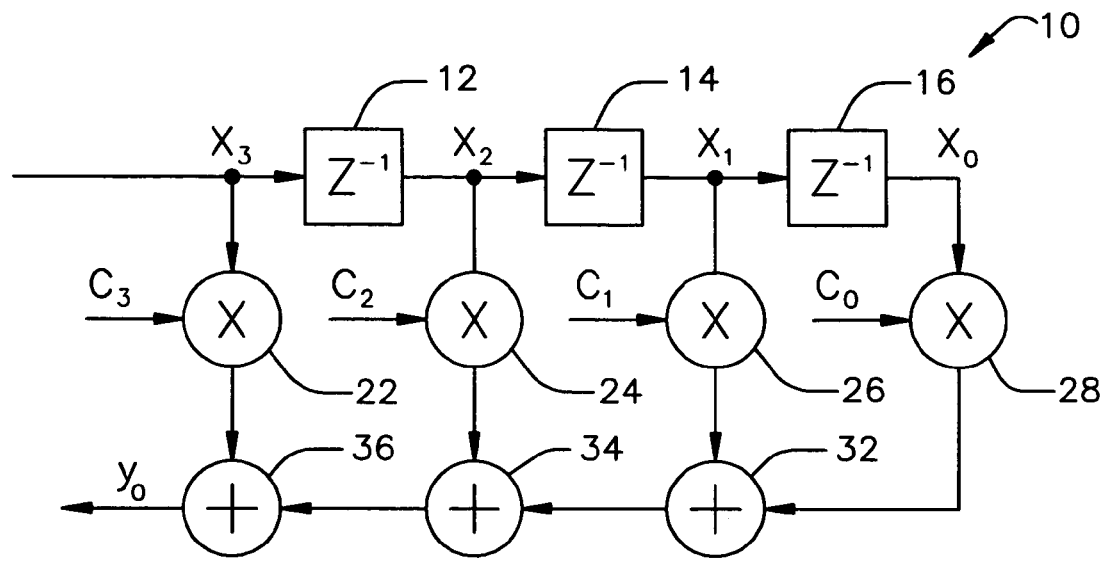
FIG. 1 illustrates an example of a four tap finite impulse response filter.
Figure 2:
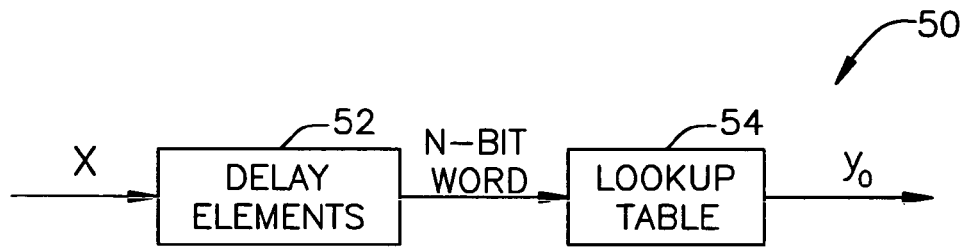
FIG. 2 illustrates an example of a thermometer coded output finite impulse response filter.
Figure 3:
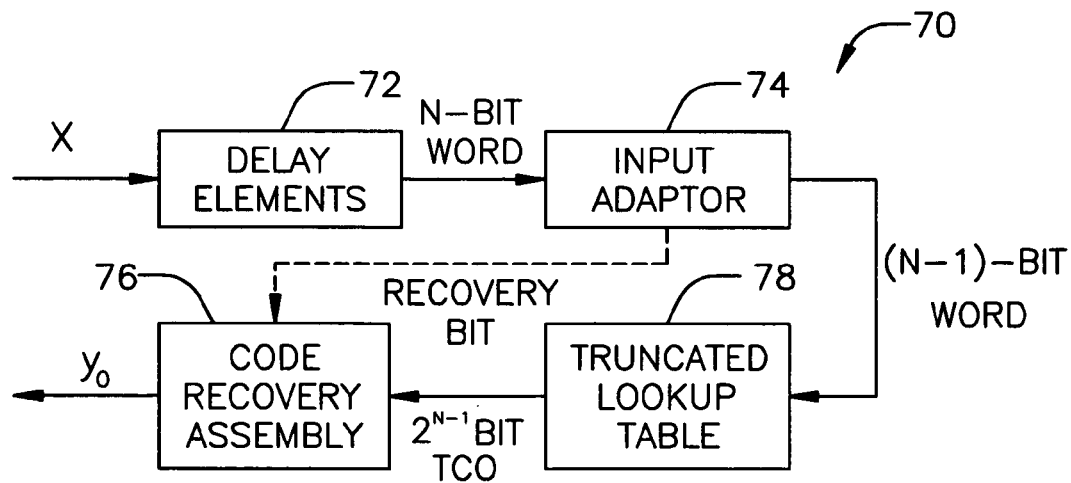
FIG. 3 illustrates a thermometer coded output finite impulse response filter in accordance with an aspect of the present invention.

FIG. 3 illustrates a thermometer coded output filter 70 in accordance with the present invention. The filter 70 includes a series of delay elements 72 that allow an N bit word to be extracted from a digital input stream for processing, where N is an integer greater than one. For example, the delay elements 72 can comprise a series of flip-flops, each holding a digital value representing a bit in the input stream. The extracted N bit word is provided to an input adaptor 74. The input adaptor 74 transforms the N bit word into an N−1 bit word and a recovery bit. For example, the input adaptor can include N−1 exclusive OR gates that receive the recovery bit (e.g., the most significant bit (MSB) from input word) as a first input and the remaining N−1 bits as respective second inputs. Accordingly, the N−1 remaining bits are outputted unchanged from the input adaptor 74 when the recovery bit is a zero, and the inverse of the N−1 bits are outputted when the recovery bit is a one. It will be appreciated that the input adaptor can be implemented differently depending on the configuration of other components within the filter 70.

The recovery bit from the input adaptor is provided to a code recovery assembly 76. The N−1 bit word is provided to a truncated lookup table 78. The truncated lookup table 78 contains a series of $2^{N-1}$ N−1 bit addresses, associated with a selected recovery bit value. For example, the addresses can represent a four bit address comprising the three bit address and a recovery bit of zero. Each address has a corresponding truncated thermometer code. It will be appreciated that the use of the N−1 bit input effectively halves the number of the addresses and associated thermometer codes required in the table.

The truncated lookup table 78 also utilizes certain redundancies in the thermometer coded outputs to further reduce the size of the table. For example, under one thermometer coding scheme, a $2^N-1$ bit thermometer coded output contains at least $2^{-1}$ ones if it is positive and $2^{-1}$ zeros if it is negative. All of these $2^{-1}$ bits can be collapsed into one sign bit that indicates a desired sign of the output. This leaves $2^{-1}$ bits for each entry, including a $2^{-1}-1$ bit word and the sign bit. The result is an $2^{-1} \times 2^{-1}$ bit table, which requires only about a quarter of the memory or chip space associated with an $2^N \times (2^N-1)$ bit table.

The N−1 bit input word is matched to one of the series of addresses, and the corresponding thermometer coded output is provided to the code recovery assembly 76. The code recovery assembly 76 reconstitutes a $2^N-1$ bit thermometer coded output from the $2^{-1}$ bit output from the truncated lookup table 78. At the code recovery assembly 76, it can be determined if the recovery bit matches the selected recovery bit value associated with the truncated lookup table 78. If so, the $2^{-1}$ bit value provided by the truncated lookup table 78 is accepted. The sign bit is expanded out to a group of $2^{-1}$ identical bits to complete a $2^N-1$ bit thermometer coded output. If the recovery bit does not match the recovery bit value, the $2^{-1}$ bit value from the truncated lookup table is inverted, and the inverted sign bit is expanded to complete a $2^N-1$ bit thermometer coded output.

FIG. 4 illustrates an exemplary lookup table 80 that could be utilized within a thermometer coded output finite impulse response filter. The lookup table 80 includes an address column 82 containing sixteen four bit addresses. Each bit in the address column 82, in essence, represents the sign of a coefficient associated with the filter. For example, for a filter having four coefficients, $c_3-c_0$, the address 1011 can indicate a value equal to $+c_3-c_2+c_1+c_0$. The value associated with each address is provided as a fifteen bit thermometer coded output (TCO) within a TCO column 84. For example, a TCO can range between negative fifteen and fifteen, having a value equal to the difference between the number of ones in the output and the number of zeros.

The lookup table 80 in FIG. 4 contains a large amount of redundant data. For example, since each four bit address provides the signs for a series of coefficients defining a desired output value, inverting the bits of the address will result in the additive inverse of the original value. Accordingly, half of the addresses on the table can be omitted as their associated values can be derived from their respective inverses. For example, all of the entries in which the most significant bit (MSB) of the address is equal to one can be omitted from the table.

Similarly, when the bits in the thermometer coded output are grouped as illustrated, the center bit of a given thermometer coded output indicates whether the majority of bits in the output are ones or zeros. In other words, if the center bit is a zero, all seven bits to its right are zeros, and if the center bit is a one, all of the bits to its left are ones. Accordingly, eight bits of information in each entry can be effectively collapsed into the center bit, referred to hereinafter as the sign bit because it is indicative of the algebraic sign of the output value.

FIG. 5 illustrates an exemplary truncated lookup table 90 in accordance with an aspect of the present invention. The truncated lookup table 90 is approximately one-quarter of the size of the lookup table illustrated in FIG. 4, but the transacted lookup table can be used to provide the same thermometer coded output as the lookup table of FIG. 4. The transacted lookup table 90 accepts a three bit input and compares it to a series of three bit addresses within an address column 92. The three bit input can be derived from a four bit input, such that the three bit input represents a selected three bits of the four bit output when the remaining bit, referred to herein as the recovery bit, is a zero and the inverse of the selected three bits when the recovery bit is a one.

The addresses are associated with respective eight bit truncated thermometer codes 94. A given truncated thermometer code represents the desired thermometer code for a four bit digital input comprising a recovery bit of zero and the three bit address. The truncated thermometer codes include respective sign bits 96 that indicate the desired algebraic sign of the desired thermometer coded output when the recovery bit is zero. If the recovery bit is a one, the truncated code, including its associated sign bit, is inverted. The truncated code can then be padded with seven ones or zeros, depending on the desired sign of the output, to replace the truncated portion of the table 90.

For example, in the illustrated table, the address 101 has a sign bit of one, indicating that the thermometer coded output should be negative when the recovery bit is zero. Assuming the original input was 0101, the eight bit truncated code provides eight bits of the final fifteen bit thermometer coded output. Since the sign bit for this entry is one, seven ones are added on the front end of the output. If the original output had been 1010, the 010 portion of the input would be inverted to provide 101, providing the same address on the truncated table. Since the recovery bit is one, however, the truncated code entry will be inverted, making the sign bit a zero. The inverted code provides eight bits of the final thermometer coded output and seven zeros, corresponding to the sign bit of zero, are added onto the back end of the output. Comparing these results to the table illustrated in FIG. 4, it will be appreciated that no information is lost in the truncation of the lookup table.

Figure 6:
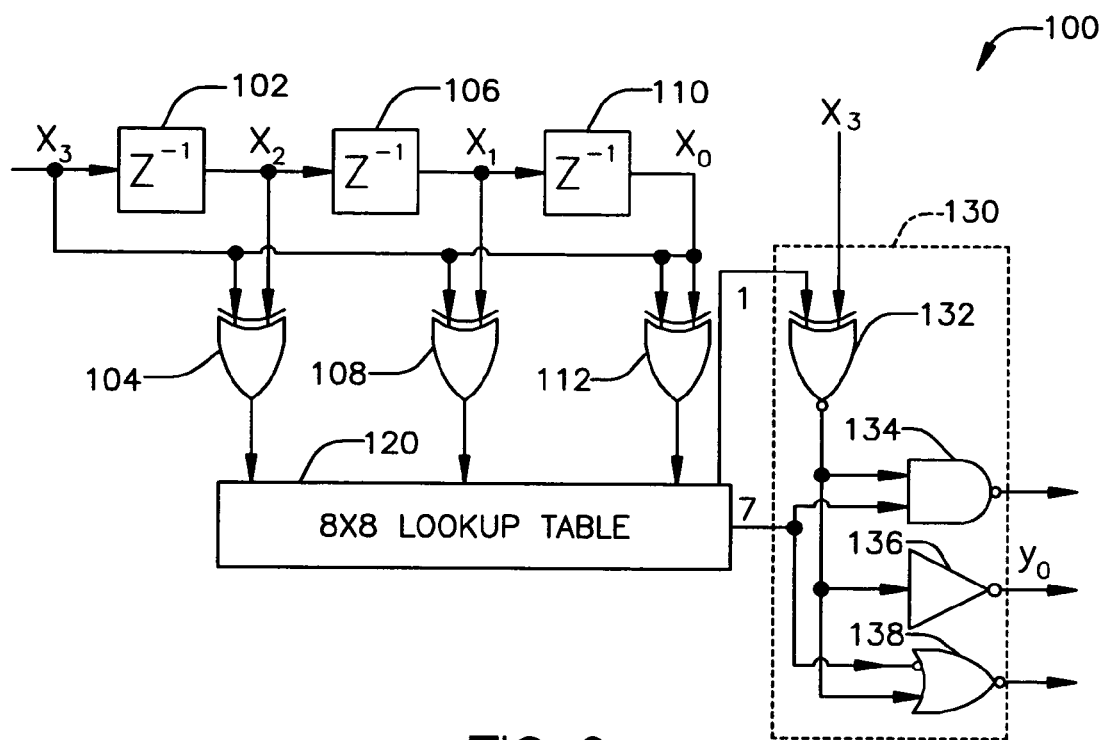
FIG. 6 illustrates an exemplary implementation of a thermometer coded finite impulse response filter.

FIG. 6 illustrates an exemplary implementation of a thermometer coded finite impulse response filter 100. The illustrated filter receives a digital signal, filters it in accordance with an associated transfer function, and translates the output into a thermometer coded output signal. In the illustrated implementation, the filter 100 is a four-tap filter used to provide a desired predistortion to a digital signal. For example, the filter can predistort the signal to mitigate the signal distortion expected at an associated amplifier.

A digital input comprises four input bits ($X_3$–$X_0$). A first digital input ($X_3$) is provided from the input to a first delay element 102 from a plurality of delay elements 102, 106, and 110 in a series. A second input bit ($X_2$) is provided from the output of the first delay element 102. The second input bit ($X_2$) is provided to a first XOR gate 104 as a first input. A third input bit ($X_1$) is provided from the output of a second delay element 106. The third input bit ($X_1$) is provided to a second XOR gate 108 as a first input. A fourth input bit, provided from the output of a third delay element 110, is provided as a first input to a third XOR gate 112. The first input bit ($X_3$) is provided as a second input to each of the XOR gates 104, 108, and 112. It will be appreciated that the output of XOR gates 104, 108, 112 will be a three bit word, in which each bit indicates the relationship of the first bit ($X_3$) to the second through fourth bits ($X_2$, $X_1$, and $X_0$). Accordingly, if the first bit ($X_3$) is logic low, the second, third, and fourth input bits are output unchanged, and when the first bit ($X_3$) is logic high, the respective inverses of the second, third, and fourth input bits are output.

The three bit word is provided to a truncated lookup table 120 in accordance with an aspect of the present invention. The lookup table 120 contains eight encoded outputs, each associated with a three bit address. A given encoded output comprises a seven bit word and a sign bit indicating the sign (e.g., positive or negative) of a thermometer coded output associated with the seven bit word. In the illustrated example, the lookup table is similar to that illustrated in FIG. 5. An appropriate encoded output is selected and provided to a code recovery assembly 130 based upon the three bit input.

At the code recovery assembly 130, the sign bit is provided as a first input to a XNOR gate 132. The first input bit ($X_3$) is provided as a second input to the XNOR gate 132. Accordingly, the output of the XNOR gate 132 is logic high when the sign bit matches the first input bit ($X_3$) and logic low when the sign bit is different from the first input bit. In the illustrated implementation, the truncation of the lookup table 120 entails removing a redundant portion of the table. For example, all entries within the table in having an MSB of one can be truncated, as they each have a negative counterpart in the addresses having an MSB of zero. The lookup table 120 is further truncated to remove a portion of each entry that consists solely of all ones or all zeros, leaving seven information carrying bits. The sign bit represents the bits that were removed from the entry. The first input bit ($X_3$) indicates whether the desired thermometer coded output is the selected address or its negative. Accordingly, the XNOR gate 132 produces a logic high when it is necessary to restore truncated zeros and a logic low when it is necessary to restore truncated ones.

The output of the XNOR gate 132 is provided to each of a bank of seven NAND gates 134, an inverter 136, and a bank of seven NOR gates 138 as a first input. Each bit from the seven bit word output from the lookup table 120 is provided as a second input to an associated one of the seven NAND gates 134. The seven NOR gates 138 each receive a bit from an inversion of the seven bit word. In the illustrated example, when the output of the XNOR gate 132 is logic high, accordingly, the seven NAND gates 134 output the inverted seven bit word and the NOR gates 138 output seven logic lows. The inverter 136 outputs an eighth logic low bit to provide a fifteen bit thermometer coded output. Similarly, when the output of the XNOR gate 132 is logic low, the seven NAND gates 134 each output a logic high and the seven NOR gates 132 output the seven bit word. The inverter 136 provides an eighth logic high bit to provide a fifteen bit thermometer coded output. It will be appreciated that the described filter provides increased efficiency, but at a cost of an increase in the critical path of the filter, due to the XNOR gate 132.

Figure 7:
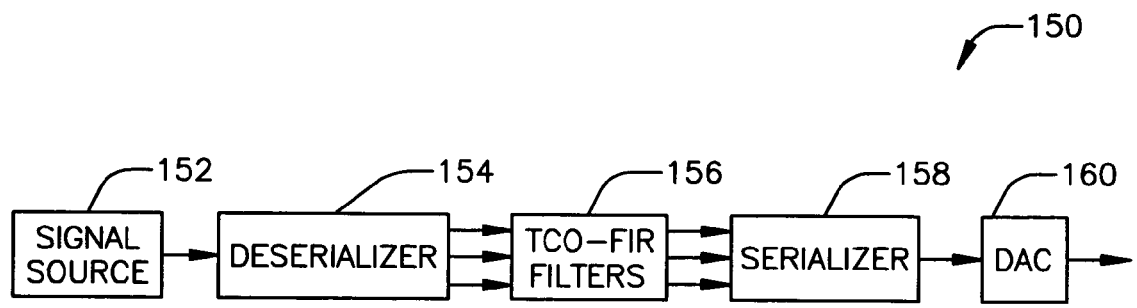
FIG. 7 illustrates an exemplary transmission system utilizing thermometer coded output finite impulse response filter.

FIG. 7 illustrates an exemplary transmission system 150 utilizing thermometer coded output finite impulse response (TCO-FIR) filter. The transmission system 150 includes a signal source 152 that provides a digital signal carrying desired information. The digital stream is split into a plurality of parallel digital streams at a deserializer 154. The deserializer 154 divides the input stream into M parallel streams, each having a bit rate equal to the 1/M times the original bit rate. These parallel streams are provided to respective TCO-FIR filters 156.

The TCO-FIR filters 156 apply a precorrection to the digital signal to mitigate distortion expected within a transmission channel (e.g., circuit board backplane, RF channel) associated with the transmission system 150 and output respective thermometer coded outputs representing the precorrected digital signal. In an exemplary implementation, the transmission channel includes a circuit board backplane. It will be appreciated that the TCO-FIR 156 filters can draw upon data from all four digital streams in precorrecting the digital signal. The thermometer coded outputs from the TCO-FIR filters 156 are provided to a serializer 158 which serializes the thermometer coded outputs into successive fifteen bit outputs in an order corresponding to the order of the original filter input. The thermometer coded outputs are then provided to a digital-to-analog converter (DAC) 160 where they are converted into an analog signal having an amplitude corresponding to the thermometer coded values. The analog signal can then be processed appropriately for a given application (e.g., modulated, amplified) and transmitted over the transmission channel.

Figure 8:
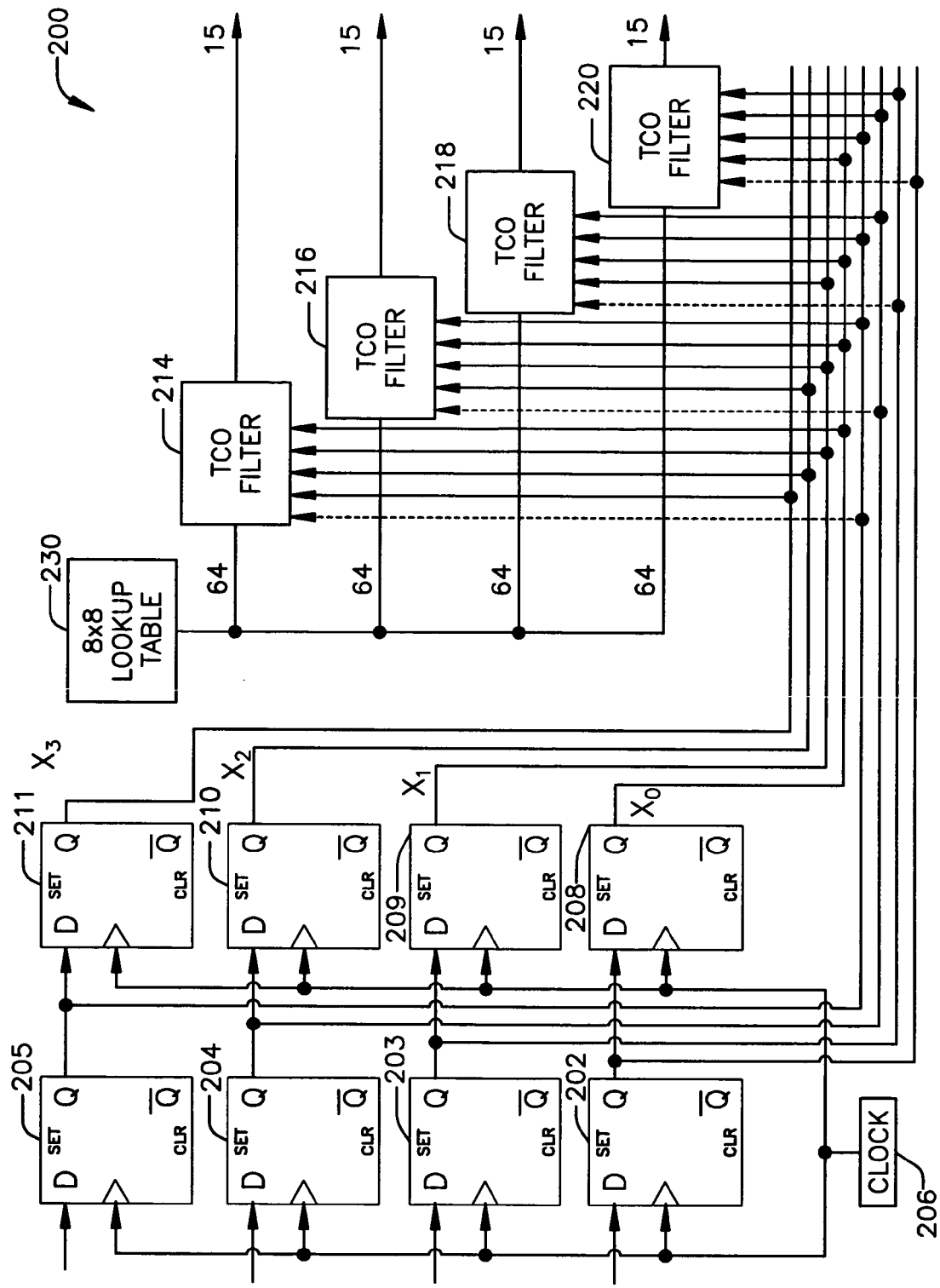
FIG. 8 illustrates an exemplary implementation of a bank of thermometer coded output finite impulse response filters.

FIG. 8 illustrates an exemplary implementation of a bank of thermometer coded output finite impulse response filters (TCO-FIR) 200. By implementing the filters in parallel, the increase in critical path associated with the recovery phase of filters can be mitigated by reading the most significant bit (MSB) of the next input (e.g., the input for the next clock cycle) in advance. Accordingly, the input bit utilized to control the XOR gate in each filter can be provided prior to the actual input as an advance recovery bit to remove the XOR gate from the critical timing path.

In the exemplary implementation, a digital input stream is received as four parallel streams at a first bank of four flip-flops, comprising a first flip-flop 202, a second flip flop 203, a third flip-flop 204, and a fourth flip-flop 205. Each flip-flop (e.g., 202) holds one bit of its respective digital input stream until it receives a clock signal from an associated clock 206. Once the clock signal is received, each of the first bank of four flip-flops 202–205 passes its held bit to an associated flip-flop in a second bank of four flip-flops, comprising a fifth flip-flop 208, a sixth flip-flop 209, a seventh flip-flop 210, and an eighth flip-flop 211. It will be appreciated that the number of streams and the corresponding number of flip-flops used to hold the signal can vary with the application.

The outputs of the second bank of flip-flops 208–211 are provided to a first thermometer coded output (TCO) filter 214 as a four bit input. The output of the fourth flip-flop 205 is also provided, as an advance recovery bit for the next clock cycle of operation. A second TCO filter 216 receives the output of the seventh flip-flop 210, the sixth flip-flop 209, the fifth flip-flop 208, and the fourth flip-flop 205. The output of the third flip-flop 204 is provided to the second TCO filter 216, as an advance recovery bit for the next clock cycle of operation. A third TCO filter 218 receives the output of the sixth flip-flop 209, the fifth flip-flop 208, the fourth flip-flop 205, and the third flip-flop 204. The output of the second flip-flop 203 is provided to the third TCO filter 218, as an advance recovery bit for the next clock cycle of operation. A fourth TCO filter 220 receives the output of the fifth flip-flop 208, the fourth flip-flop 205, the third flip-flop 204, and the second flip-flop 203. The output of the first flip-flop 202 is provided to the fourth TCO filter 220, as an advance recovery bit for the next clock cycle of operation. Each of the TCO filters 214, 216, 218, and 220 also receives lookup table data from a common truncated lookup table 230.

Each filter (e.g., 214) processes its four bit input word, the provided lookup table data, and the recovery bit provided during the previous clock cycle to provide an associated fifteen bit thermometer coded output. It will be appreciated that the first bank of flip-flops 202–205 are utilized in providing respective four bit input words to the second, third, and fourth filters 216, 218, and 220. Accordingly, the additional advance recovery bit provided to each filter is already provided from existing hardware, providing a reduction in the critical timing paths of the filters without any further expenditure of chip space or power. The described system 200 thus provides a significant reduction in the space requirements of the lookup table 230 without any increase in the critical timing path of the system.

Figure 9:
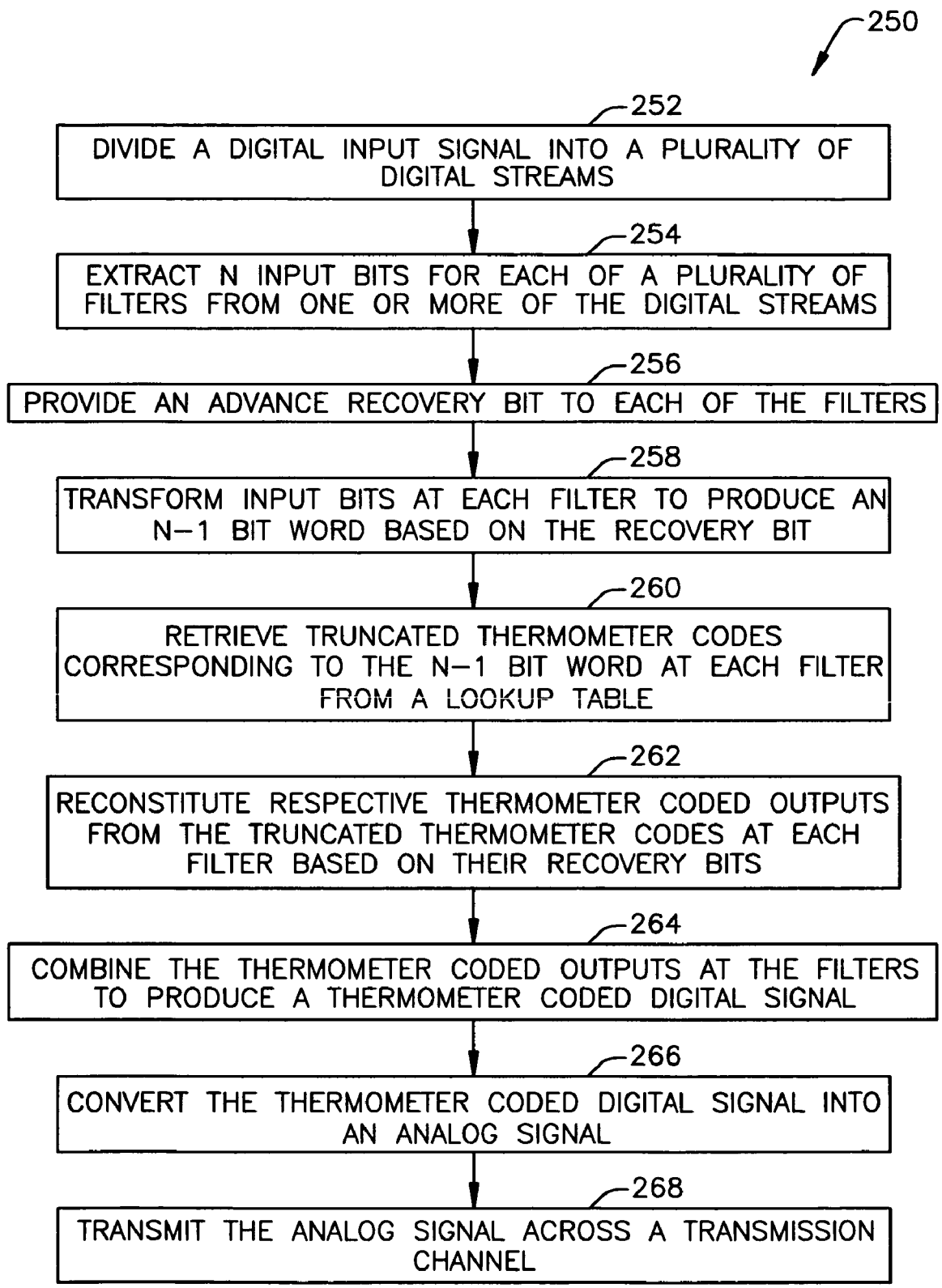
FIG. 9 illustrates a methodology for filtering a digital signal to produce a precorrected thermometer coded output.

Referring now to FIG. 9, there is illustrated a methodology 250 in accordance with an aspect of the present invention. While, for purposes of simplicity of explanation, a methodology is shown and described as executing serially, it is to be understood and appreciated that the present invention is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

FIG. 9 illustrates a methodology 250 for filtering a digital signal to produce a precorrected thermometer coded output. At 252, the digital signal is divided into a plurality of digital streams. At 254, N input bits are extracted from one or more of the digital streams and provided to each of a plurality of filters. Each of the plurality of filters are operative to apply predistortion to its digital input as to mitigate a distortion induced by an associated transmission channel. An advance recovery bit is also provided to each of the filters at 256. A given advanced recovery bit provides a recovery bit for a subsequent input to its associated filter. Accordingly, the recovery bit is available for a recovery operation at the filters prior to its associated input, mitigating the increase in the critical timing path of the filter caused by the recovery operation.

The N input bits at each filter are transformed at 258 to produce respective N−1 bit words. In an exemplary implementation, the composition of a given N−1 bit word is determined according to the value of the recovery bit provided to the filter. For example, the most significant bit of the digital input can represent the recovery bit and the N−1 bit word can be comprised of the remaining N−1 bits when the recovery bit assumes a first value and be comprised of the inverse of the remaining N−1 bits when the recovery bit assumes a second value.

At 260, the N−1 bit word at each filter is compared to a lookup table, and respective corresponding truncated thermometer code is retrieved. A given truncated thermometer code can include a sign bit that represents a larger number of bits in a desired thermometer coded output according to an associated algebraic sign of the desired thermometer coded output. The truncated codes are then expanded at 262 to produce respective thermometer coded outputs corresponding to the N bit inputs. The sign bit and the recovery bit at each filter can be utilized in the recovery of the thermometer coded output. Once a thermometer coded output has been produced at each filter, they are combined at 264 to form a thermometer coded digital signal. The thermometer coded signal is converted into an analog signal at 266, and transmitted across the transmission channel at 268. In an exemplary implementation, the transmission channel includes a circuit board backplane.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A filter system for providing a filtered, thermometer coded output signal from an N bit digital input, where N is an integer greater than one, comprising:
   a truncated lookup table that provides a corresponding truncated thermometer code in response an address related to the N bit digital input; and
   a code recovery assembly that transforms the truncated thermometer code into a thermometer coded output according to a recovery bit associated with the digital input.

2. The system of claim 1, further comprising an input adaptor that transforms the digital input into the recovery bit and an associated N−1 bit word, the N−1 bit word being provided to the truncated lookup table as the address.

3. The system of claim 2, wherein the input adaptor comprises a plurality of exclusive OR gates.

4. The system of claim 1, wherein the code recovery assembly includes an exclusive NOR gate that compares the recovery bit with a sign bit associated with the truncated thermometer code to determine a desired algebraic sign for the thermometer coded output.

5. The system of claim 4, wherein the code recovery assembly includes a plurality of NAND gates that provide at least a portion of an inverse of the truncated thermometer code when an associated output of the exclusive NOR gate is logic high and a series of logic highs when the associated output of the exclusive NOR gate is logic low.

6. The system of claim 4, wherein the code recovery assembly includes a plurality of NOR gates that provide at least a portion of the truncated thermometer code when an associated output of the exclusive NOR gate is logic low and a series of logic lows when the associated output of the exclusive NOR gate is logic high.

7. A transmission system, comprising:
a deserializer that splits a digital input signal into M input streams, each providing an N bit digital input, where M and N are integers greater than one;
M thermometer coded output filter systems that filter the respective N bit digital inputs and output respective thermometer coded outputs associated with their associated input stream, each filter system including a truncated lookup table that provides a corresponding truncated thermometer code in response to an address related to the respective N bit digital input; and each filter system further including a code recovery assembly that transforms the corresponding truncated thermometer code into a the respective thermometer coded output according to a recovery bit associated with the digital input; and
a serializer that recombines the outputs of the M filter systems into a thermometer coded digital signal.

8. The system of claim 7, further comprising a digital-to-analog converter (DAC) that converts the thermometer digital signal into an analog signal.

9. The system of claim 8, wherein the analog signal is transmitted along an associated transmission channel comprising a circuit board backplane.

10. The system of claim 7, a given digital input being one of a series of digital inputs to its associated filter and each of the M thermometer coded filter systems receiving an advance bit associated with a subsequent digital input in the series in advance of the digital input.

11. The system of claim 10, the advance bit comprising the recovery bit for the subsequent digital input.

12. The system of claim 7, at least one of the M thermometer coded filter systems comprising a finite impulse response filter.

13. A method for transmitting a digital signal across a transmission channel, comprising:
dividing the digital signal into M digital streams, where M is an integer greater than one;
providing respective N bit input signals to M filters, where N is an integer greater than one, each filter being associated with one of the M digital streams;
providing respective advance recovery bits to the M filters, a given advance recovery bit being associated with a subsequent N bit input to its associated filter;
filtering each digital stream to produce M thermometer coded outputs, each precorrected for a distortion associated with the transmission channel; and
combining the thermometer coded outputs to produce a thermometer coded digital signal.

14. The method of claim 13, wherein filtering a digital stream to produce a precorrected thermometer coded output comprises:
adapting the N bit digital input to provide a recovery bit and an associated N−1 bit word;
retrieving a truncated thermometer code corresponding to the N−1 bit word; and
reconstituting a thermometer coded output from the truncated thermometer code according to the recovery bit.

15. The method of claim 14, further comprising:
converting the thermometer coded digital signal into an analog signal; and
transmitting the analog signal along the transmission channel.

16. The method of claim 15, wherein transmitting the analog signal along the transmission channel includes transmitting the analog signal along a backplane associated with a circuit board.

17. A transmission system, comprising a filtering means, the filtering means comprising:
means for retrieving a truncated thermometer code in response to a digital input; and
means for reconstituting a thermometer coded output associated with the digital input from the truncated thermometer code.

18. The system of claim 17, the filter means further comprising means for adapting a digital signal to provide an appropriate digital input to the means for retrieving.

19. The system of claim 17, the transmission system further comprising:
means for deserializing a digital signal to produce a plurality of digital inputs for the filtering means;
means for serializing a plurality of thermometer coded outputs from the filtering means; and
means for converting the serialized thermometer coded outputs into an analog signal.

20. The system of claim 17, the filter means comprising means for providing a recovery bit to the means for reconstituting in advance of the digital input as to reduce a critical path associated with the filter means.

* * * * *